US010909390B2

(12) United States Patent
Zeng et al.

(10) Patent No.: US 10,909,390 B2
(45) Date of Patent: Feb. 2, 2021

(54) FIXED-POINT QUANTIZATION IN NEURAL NETWORKS FOR VEHICLE PERCEPTION SYSTEMS

(71) Applicant: GM GLOBAL TECHNOLOGY OPERATIONS LLC, Detroit, MI (US)

(72) Inventors: Shuqing Zeng, Sterling Heights, MI (US); Wei Tong, Troy, MI (US); Shige Wang, Northville, MI (US); Roman L. Millett, Clinton Township, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 210 days.

(21) Appl. No.: 16/170,478

(22) Filed: Oct. 25, 2018

(65) Prior Publication Data

US 2020/0134324 A1    Apr. 30, 2020

(51) Int. Cl.
*G06N 3/08* (2006.01)
*G06K 9/00* (2006.01)
*H03M 7/24* (2006.01)

(52) U.S. Cl.
CPC ..... *G06K 9/00791* (2013.01); *G06K 9/00993* (2013.01); *G06N 3/08* (2013.01); *H03M 7/24* (2013.01)

(58) Field of Classification Search
CPC .. G06K 9/00993; G06K 9/00791; G06N 3/08; H03M 7/24
See application file for complete search history.

(56) References Cited

U.S. PATENT DOCUMENTS

| | | | |
|---|---|---|---|
| 2019/0042927 A1* | 2/2019 | Keskin | G06N 3/08 |
| 2019/0244080 A1* | 8/2019 | Li | G06N 3/063 |
| 2020/0097831 A1* | 3/2020 | Wang | G06F 9/3877 |
| 2020/0125112 A1* | 4/2020 | Mao | G06K 9/00805 |

* cited by examiner

*Primary Examiner* — Sam Bhattacharya
(74) *Attorney, Agent, or Firm* — Cantor Colburn LLP (57) ABSTRACT

Examples of techniques for using fixed-point quantization in deep neural networks are disclosed. In one example implementation according to aspects of the present disclosure, a computer-implemented method includes capturing a plurality of images at a camera associated with a vehicle and storing image data associated with the plurality of images to a memory. The method further includes dispatching vehicle perception tasks to a plurality of processing elements of an accelerator in communication with the memory. The method further includes performing, by at least one of the plurality of processing elements, the vehicle perception tasks for the vehicle perception using a neural network, wherein performing the vehicle perception tasks comprises quantizing a fixed-point value based on an activation input and a synapse weight. The method further includes controlling the vehicle based at least in part on a result of performing the vehicle perception tasks.

18 Claims, 6 Drawing Sheets

FIXED-POINT QUANTIZATION IN NEURAL NETWORKS FOR VEHICLE PERCEPTION SYSTEMS

The subject disclosure relates to controlling a vehicle and, more particularly, to fixed-point quantization in neural networks for vehicle perception systems.

Machine learning involves the generation and use of algorithms capable of learning from and making predictions on data. Such algorithms typically operate by building a model from example inputs in order to make data-driven predictions or decisions. A number of machine learning approaches have been developed. One such approach, known as an artificial neural network (ANN), or simply a neural network (NN), is a learning algorithm inspired by the structure and function of biological neural networks.

An NN includes hierarchal layers of interconnected groups of artificial neurons (nodes), where each layer of nodes receives as inputs, the outputs of a lower layer. Deep neural networks (DNNs) are a type of NN that includes one or more hidden layers of nodes. Feed-forward NNs are NNs in which connections between the nodes do not form a cycle. That is, feed-forward NNs are NNs in which the information moves in only one direction, forward, from the input nodes, through the nodes of one or more hidden layers (if any), and ultimately to the output nodes. Convolutional NNs constitute a class of deep, feed-forward NNs that include input and output layers as well as multiple hidden layers. The hidden layers typically include convolutional layers, pooling layers, fully-connected layers, and normalization layers. Technical improvements to conventional NNs are described herein.

SUMMARY

In one exemplary embodiment, a computer-implemented method includes capturing a plurality of images at a camera associated with a vehicle and storing image data associated with the plurality of images to a memory. The method further includes dispatching vehicle perception tasks to a plurality of processing elements of an accelerator in communication with the memory. The method further includes performing, by at least one of the plurality of processing elements, the vehicle perception tasks for the vehicle perception using a neural network, wherein performing the vehicle perception tasks includes quantizing a fixed-point value based on an activation input and a synapse weight. The method further includes controlling the vehicle based at least in part on a result of performing the vehicle perception tasks.

In addition to one or more of the features described herein, in some examples the method further includes performing a batch normalization on the fixed-point value. In some examples, the batch normalization is performed to determine yi as follows:

$$y_i = ReLu[BN[\sum w_{ik}x_k + b]] = \begin{cases} 0 & \text{if } \sum \tilde{w}_{ik}x_k + \tilde{b} < 0 \\ \sum \tilde{w}_{ik}x_k + \tilde{b}, & \text{Otherwise} \end{cases}$$

where $\tilde{w}_{ik}=\gamma w_{ik}$ and $\tilde{b}=b+\beta$, where $\gamma$ and $\beta$ are parameters from a batch normalization layer of the neural network. In some examples, performing the batch normalization includes performing a 1-bit left-shift on the fixed-point value using a shift register. In some examples, the fixed-point value is an 8-bit fixed-point value. In some examples, quantizing the fixed-point value includes converting a floating-point value into the fixed-point value. In some examples, the quantized fixed-point value is expressed as follows:

$$Q(x) = \begin{cases} -2^{IL-1}, & x \leq -2^{IL-1} \\ 2^{IL-1} - \epsilon, & x \geq 2^{IL-1} - \epsilon \\ \lfloor x \rfloor, & \lfloor x \rfloor \leq x \leq \lfloor x \rfloor + \frac{\epsilon}{2} \\ \lfloor x \rfloor + \epsilon, & \lfloor x \rfloor + \frac{\epsilon}{2} < x \leq \lfloor x \rfloor + \epsilon \end{cases}$$

where IL is determined as floor($\log_2 3\sigma$) where $\sigma$ is the standard deviation of a probability density function, FL is determined as 8−IL, $\epsilon=2^{-FL}$, and $\lfloor x \rfloor$ is a largest multiplier of $\epsilon$, which is a value of precision. In some examples, the accelerator further includes a neural processing unit instruction fetcher, a dispatcher, a level 1 cache, and a level 2 cache. In some examples, the accelerator is communicatively coupled to a host central processing unit via the memory, wherein the accelerator is a special purpose processor and wherein the host central processing unit is a general purpose processor. In some examples, the host central processing unit receives the image data from the camera associated with the vehicle and stores the image data associated with the plurality of images to the memory.

In another exemplary embodiment, a system includes a memory having computer readable instructions and a processing device for executing the computer readable instructions for performing a method. The method includes capturing a plurality of images at a camera associated with a vehicle and storing image data associated with the plurality of images to a memory. The method further includes dispatching vehicle perception tasks to a plurality of processing elements of an accelerator in communication with the memory. The method further includes performing, by at least one of the plurality of processing elements, the vehicle perception tasks for the vehicle perception using a neural network, wherein performing the vehicle perception tasks includes quantizing a fixed-point value based on an activation input and a synapse weight. The method further includes controlling the vehicle based at least in part on a result of performing the vehicle perception tasks.

In addition to one or more of the features described herein, in some examples the method further includes performing a batch normalization on the fixed-point value. In some examples, the batch normalization is performed to determine yi as follows:

$$y_i = ReLu[BN[\sum w_{ik}x_k + b]] = \begin{cases} 0 & \text{if } \sum \tilde{w}_{ik}x_k + \tilde{b} < 0 \\ \sum \tilde{w}_{ik}x_k + \tilde{b}, & \text{Otherwise} \end{cases}$$

where $\tilde{w}_{ik}=\gamma w_{ik}$ and $\tilde{b}=b+\beta$, where $\gamma$ and $\beta$ are parameters from a batch normalization layer of the neural network. In some examples, performing the batch normalization includes performing a 1-bit left-shift on the fixed-point value using a shift register. In some examples, the fixed-point value is an 8-bit fixed-point value. In some examples, quantizing the fixed-point value includes converting a floating-point value into the fixed-point value. In some examples, the quantized fixed-point value is expressed as follows:

$$Q(x) = \begin{cases} -2^{IL-1}, x \leq -2^{IL-1} \\ 2^{IL-1} - \epsilon, x \geq 2^{IL-1} - \epsilon \\ \lfloor x \rfloor, \lfloor x \rfloor \leq x \leq \lfloor x \rfloor + \frac{\epsilon}{2} \\ \lfloor x \rfloor + \epsilon, \lfloor x \rfloor + \frac{\epsilon}{2} < x \leq \lfloor x \rfloor + \epsilon \end{cases}$$

where IL is determined as floor($\log_2 3\sigma$) where $\sigma$ is the standard deviation of a probability density function, FL is determined as 8−IL, $\epsilon = 2^{-FL}$, and $\lfloor x \rfloor$ is a largest multiplier of $\epsilon$, which is a value of precision. In some examples, the accelerator further includes a neural processing unit instruction fetcher, a dispatcher, a level 1 cache, and a level 2 cache. In some examples, the accelerator is communicatively coupled to a host central processing unit via the memory, wherein the accelerator is a special purpose processor and wherein the host central processing unit is a general purpose processor. In some examples, the host central processing unit receives the image data from the camera associated with the vehicle and stores the image data associated with the plurality of images to the memory.

In yet another exemplary embodiment a computer program product includes a computer readable storage medium having program instructions embodied therewith, the program instructions executable by a processing device to cause the processing device to perform a method. The method includes capturing a plurality of images at a camera associated with a vehicle and storing image data associated with the plurality of images to a memory. The method further includes dispatching vehicle perception tasks to a plurality of processing elements of an accelerator in communication with the memory. The method further includes performing, by at least one of the plurality of processing elements, the vehicle perception tasks for the vehicle perception using a neural network, wherein performing the vehicle perception tasks includes quantizing a fixed-point value based on an activation input and a synapse weight. The method further includes controlling the vehicle based at least in part on a result of performing the vehicle perception tasks.

The above features and advantages, and other features and advantages of the disclosure are readily apparent from the following detailed description when taken in connection with the accompanying drawings.

BRIEF DESCRIPTION OF THE DRAWINGS

Other features, advantages, and details appear, by way of example only, in the following detailed description, the detailed description referring to the drawings in which.

DETAILED DESCRIPTION

The following description is merely exemplary in nature and is not intended to limit the present disclosure, its application or uses. As used herein, the term module refers to processing circuitry that may include an application specific integrated circuit (ASIC), an electronic circuit, a processor (shared, dedicated, or group) and memory that executes one or more software or firmware programs, a combinational logic circuit, and/or other suitable components that provide the described functionality.

The technical solutions described herein provide for vehicle perception using deep neural networks. Vehicle perception provides for object detection and recognition by processing images captured by one or more cameras associated with a vehicle (e.g., a car, a motorcycle, a boat, or any other type of vehicle). Vehicle perception aids a driver/operator of a vehicle by providing information external to the vehicle and/or aids autonomous vehicles by providing information useful for making driving decisions (e.g., whether to accelerate, brake, turn, etc.).

Modern vehicles generally include one or more cameras that provide backup assistance, take images of the vehicle driver to determine driver drowsiness or attentiveness, provide images of the road (as the vehicle is traveling) for collision avoidance purposes, provide structure recognition, such as roadway signs, etc. For example, a vehicle can be equipped with multiple cameras, and images from multiple cameras (referred to as "surround view cameras") can be used to create a "surround" or "bird's eye" view of the vehicle. Some of the cameras (referred to as "long-range cameras") can be used to capture long-range images (e.g., for object detection for collision avoidance, structure recognition, etc.).

These vehicles may also be equipped with an in-vehicle display (e.g., a touchscreen) that is used to display camera images and/or other images to a driver of the vehicle. For example, a traditional rear-view mirror and/or side-view mirror may be replaced with a display that displays a camera image from a camera positioned at the rear of the vehicle to display the "rear view" to the driver in place of the traditional rear-view mirror.

Figure 1:
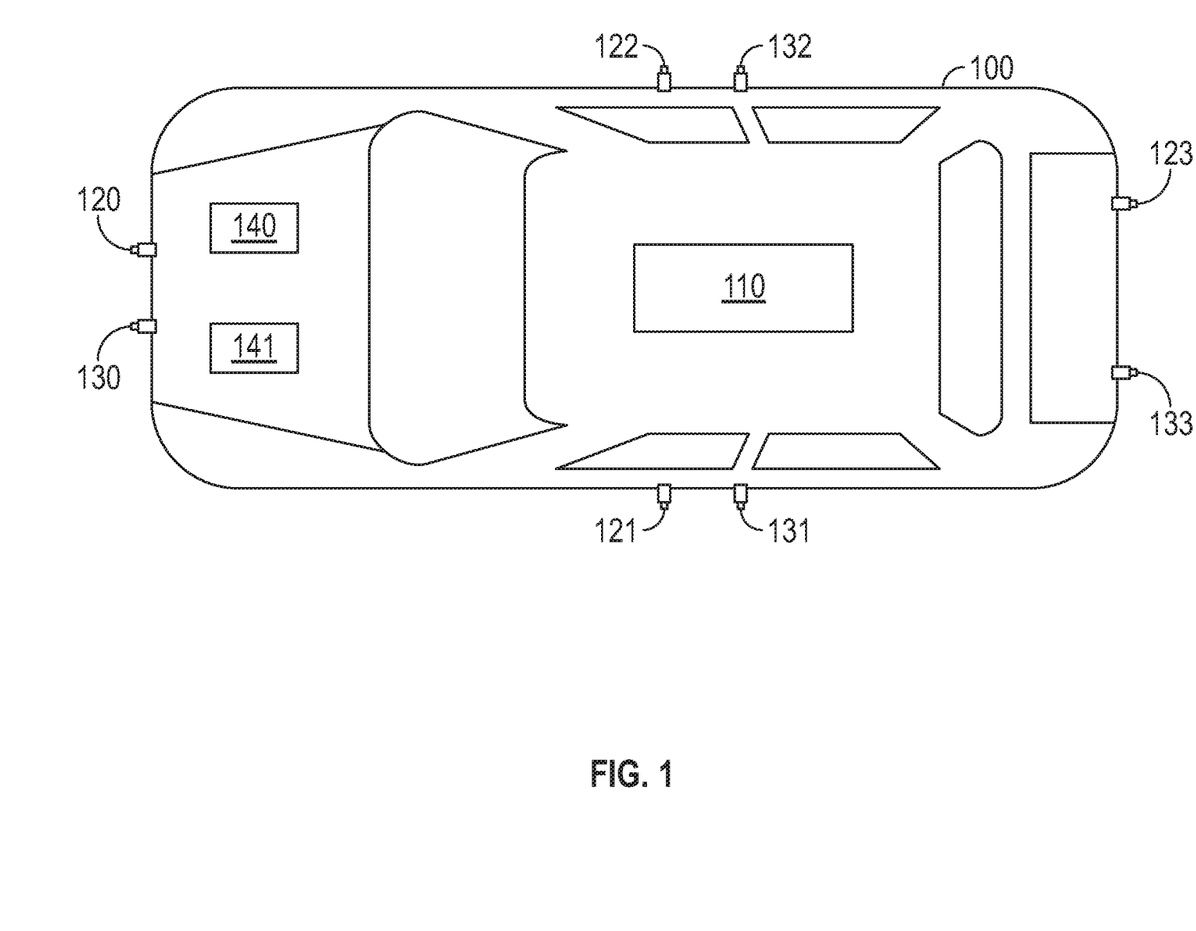
FIG. 1 depicts a vehicle including a processing system for fixed-point quantization in neural networks according to one or more embodiments described herein.

An example of such a vehicle is depicted in FIG. 1. In particular, FIG. 1 depicts a vehicle 100 including a processing system 110 for fixed-point quantization in neural networks. The vehicle 100 may be a car, truck, van, bus, motorcycle, or another suitable vehicle. The processing system 110 associated with the vehicle 100 is responsible for vehicle perception by analyzing images captured by a plurality of cameras associated with the vehicle 100.

In the example of FIG. 1, the vehicle 100 includes cameras 120, 121, 122, 123, and cameras 130, 131, 132, 133. According to one or more embodiments described herein, the cameras 120-123 are surround view cameras that capture images external to, and in near proximity to, the vehicle 100. The images captured by the cameras 120-123 together form a surround view (sometimes referred to as a "top-down view" or a "bird's eye view") of the vehicle 100. These images can be used for operating the vehicle (e.g., parking, backing, etc.). According to one or more embodiments described herein, the cameras 130-133 are long-range cameras that capture images external to the vehicle and farther away from the vehicle 100 than the cameras 120-123. These images can be processed using vehicle perception techniques using deep neural networks. The results can be used for object detection and avoidance, for example. It should be appreciated that, although eight cameras 120-123 and 130-133 are shown, more or fewer cameras may be implemented in various embodiments.

The captured images can be displayed on a display (not shown) to provide external views of the vehicle 100 to the driver/operator of the vehicle 100. The captured images can be displayed as live images, still images, or some combination thereof. In some examples, the images can be combined to form a composite view, such as the surround view. The displayed images can also be overlaid with information determined during processing/analysis. For example, an image can be overlaid with distance information (e.g., distance from the vehicle 100 to another object/vehicle), safety information (e.g., a warning of a potential collision), and the like.

The vehicle 100 can also include sensors, such as sensors 140, 141. According to one or more embodiments, the sensor 140 represents a high-resolution radar, and the sensor 141 represents a light imaging detection and ranging (Lidar) sensor. Other numbers and types of sensors can be used.

The processing system 110 uses images captured from one or more of the cameras 120-123, 130-133 to perform vehicle perception using deep neural networks. For example, the vehicle perception can include performing feature extraction, object detection and avoidance, and the like.

The various components, modules, engines, etc. described regarding FIG. 1 can be implemented as instructions stored on a computer-readable storage medium, as hardware modules, as special-purpose hardware (e.g., application specific hardware, application specific integrated circuits (ASICs), application specific special processors (ASSPs), field programmable gate arrays (FPGAs), as embedded controllers, hardwired circuitry, etc.), or as some combination or combinations of these. According to aspects of the present disclosure, the engine(s) described herein can be a combination of hardware and programming. The programming can be processor executable instructions stored on a tangible memory, and the hardware can include a processing device (e.g., the CPU 921 of FIG. 9) for executing those instructions. Thus a system memory (e.g., the RAM 924 of FIG. 9) can store program instructions that when executed by the processing device implement the engines described herein. Other engines can also be utilized to include other features and functionality described in other examples herein.

Figure 2:
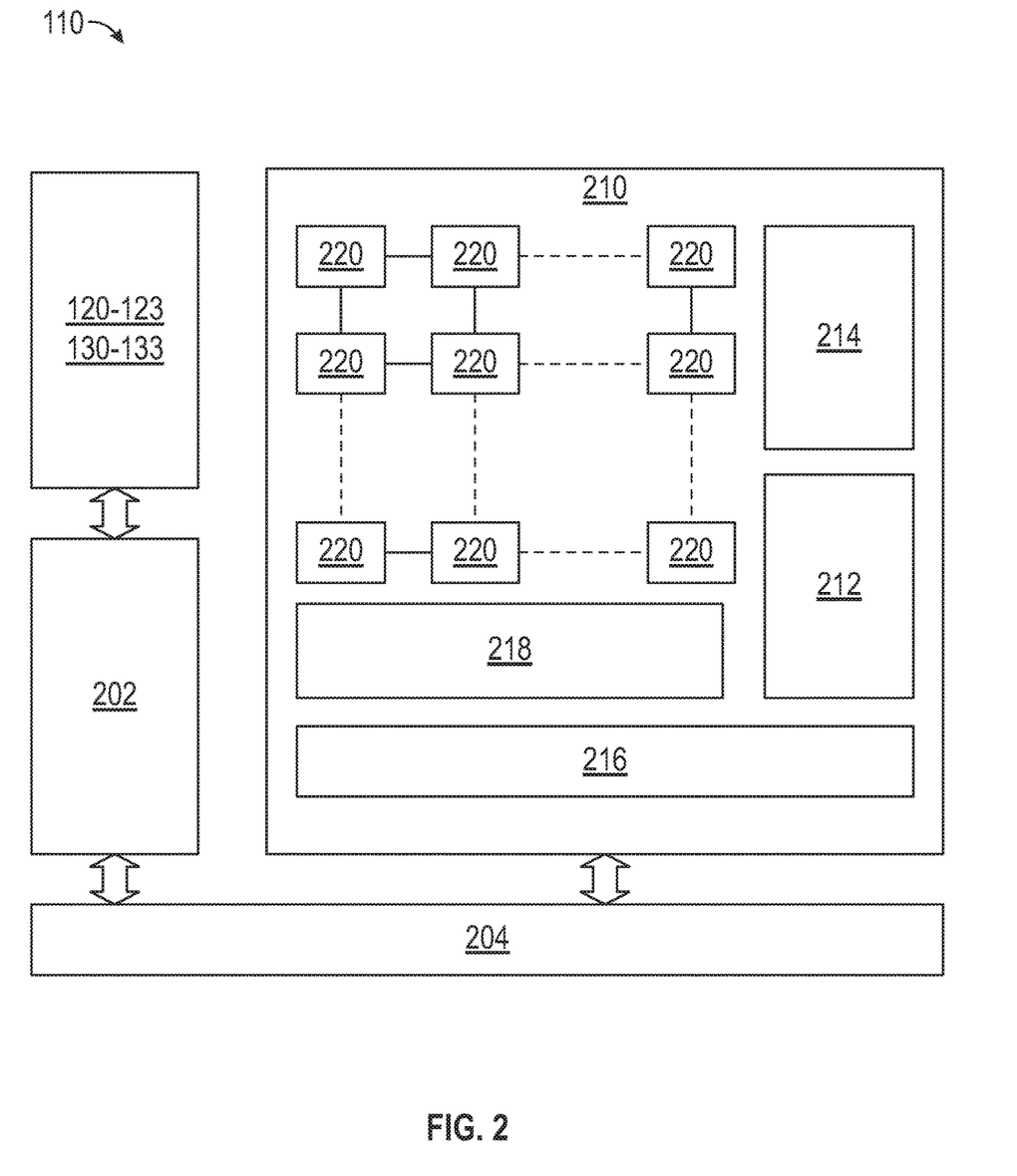
FIG. 2 depicts the processing system of FIG. 1 for fixed-point quantization in neural networks according to one or more embodiments described herein.

FIG. 2 depicts the processing system 110 of FIG. 1 for fixed-point quantization in neural networks according to one or more embodiments described herein. The processing system 110 receives images from one or more of the cameras 120-123, 130-133 at a processing device 202. The processing device 202 (also referred to as a host central processing unit) can perform object-level tracking, execute applications, and perform other general purpose tasks. In this way, the processing device 202 is a general purpose hardware device. The processing device 202 is configured to receive the images from the cameras 120-123, 130-133 and store the images as image data to a memory 204 (also referred to as a shared memory), which can be a dynamic random-access memory or another suitable memory.

A special purpose hardware device, referred to as a "neural processing unit" or "accelerator" 210, is configured to receive the image data stored in the memory 204 and perform image processing on the image data. The image processing can include point cloud processing, NN tasks, and the like. The accelerator 210 can be an ASIC, a field programmable gate array (FPGA), graphics processing unit (GPU), or another suitable special purpose hardware device.

According to one or more embodiments described herein, the accelerator 210 can utilize machine learning functionality to accomplish the various image processing/analysis described herein. More specifically, the accelerator 210 can incorporate and utilize rule-based decision making and artificial intelligence (AI) reasoning to accomplish the various operations of the accelerator 210 described herein. The phrase "machine learning" broadly describes a function of electronic systems that learn from data. A machine learning system, engine, or module can include a trainable machine learning algorithm that can be trained, such as in an external cloud environment, to learn functional relationships between inputs and outputs that are currently unknown, and the resulting model can be used to perform feature extraction, object detection, collision avoidance, and the like. In one or more embodiments, machine learning functionality can be implemented using an artificial neural network (ANN) having the capability to be trained to perform a currently unknown function. In machine learning and cognitive science, ANNs are a family of statistical learning models inspired by the biological neural networks of animals, and in particular the brain. ANNs can be used to estimate or approximate systems and functions that depend on a large number of inputs.

ANNs can be embodied as so-called "neuromorphic" systems of interconnected processor elements that act as simulated "neurons" and exchange "messages" between each other in the form of electronic signals. Similar to the so-called "plasticity" of synaptic neurotransmitter connections that carry messages between biological neurons, the connections in ANNs that carry electronic messages between simulated neurons are provided with numeric weights that correspond to the strength or weakness of a given connection. The weights can be adjusted and tuned based on experience, making ANNs adaptive to inputs and capable of learning. For example, an ANN for object detection and recognition is defined by a set of input neurons that can be activated by the pixels of an input image. After being weighted and transformed by a function determined by the network's designer, the activation of these input neurons are then passed to other downstream neurons, which are often referred to as "hidden" neurons or "hidden" layers. This process is repeated until an output neuron is activated. The activated output neuron determines what object was detected.

The accelerator 210 includes a neural processing unit (NPU) instruction fetcher 212 to fetch/receive instructions and image data from the memory 204. The instructions can include instructions to perform, for example, feature extraction, object detection, and the like. The accelerator 210 also includes a dispatcher 214 to dispatch/schedule the instructions to a plurality of processing elements 220.

The accelerator 210 also includes additional memories, such as cache 216, which can be a level 2 (L2) cache, and a global memory buffer 218, which can be a level 1 (L1) cache. The global memory buffer 218 can be a static random-access memory for example.

The processing elements 220 perform the deep neural network-based techniques for vehicle perception. In particular, the dispatcher 214 dispatches instructions and image data to the individual processing elements 220, which together process/analyze the image data to perform vehicle perception.

Figure 3A:
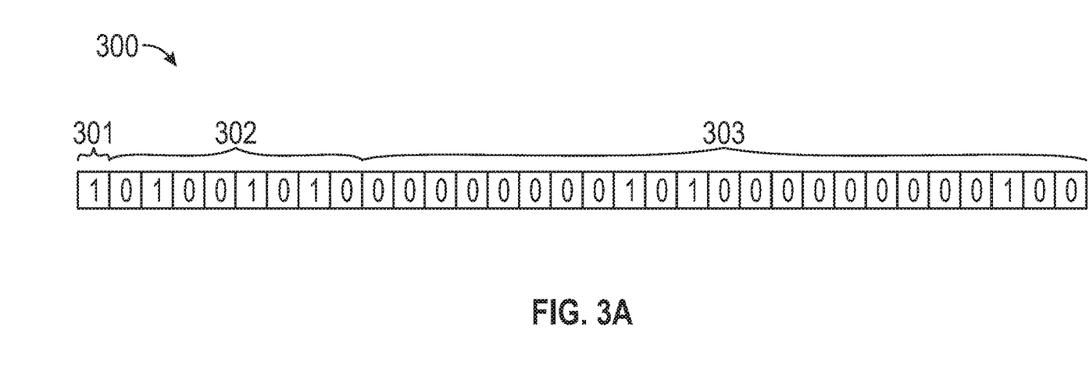
FIG. 3A depicts a 32-bit floating-point value that includes a 1-bit sign component, an 8-bit exponent component, and a 23-bit mantissa component according to one or more embodiments described herein.

Typically, the processing elements 220 utilize floating-point operations to perform instructions dispatched by the dispatcher 214. For example, FIG. 3A depicts a 32-bit floating-point value 300 that includes a 1-bit sign component 301, an 8-bit exponent component 302, and a 23-bit mantissa component 303 according to one or more embodiments described herein. The example of FIG. 3A depicts the value −1.4212e-13.

Figure 3B:
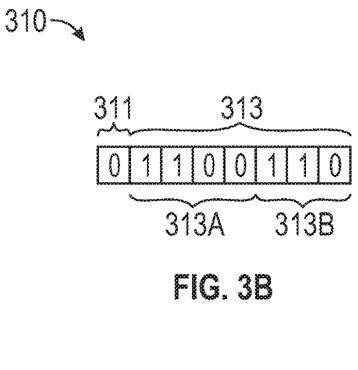
FIG. 3B depicts an 8-bit fixed-point value that includes a 1-bit sign component and a 7-bit mantissa component according to one or more embodiments described herein.

A significant reduction in processing resources and demand on the processing elements 220 can be realized by using fixed-point values instead of floating-point values. FIG. 3B depicts an 8-bit fixed-point value 310 that includes a 1-bit sign component 311 and a 7-bit mantissa component 313, which is further segmented into a 4-bit integer component 313a and a 3-bit fractional component 313b. The example of FIG. 3B depicts the value 12.75. Using fixed-point values instead of floating-point values can result in an approximate twenty-times (20×) reduction in processing power consumed by the processing elements 220, which represents a significant improvement in computer functionality.

Figure 4:
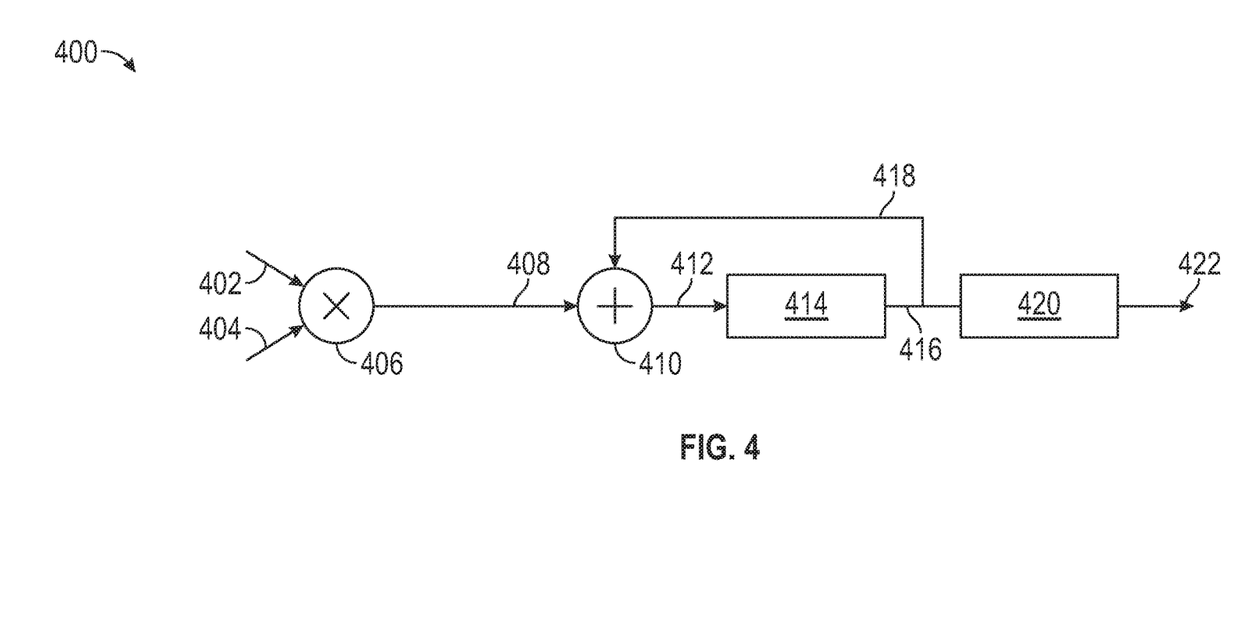
FIG. 4 depicts a block diagram for executing instructions on one or more of the processing elements of FIG. 2 in a single layer of a NN using fixed-point values instead of floating-point values according to one or more embodiments described herein.

The processing elements 220 can perform a quantization technique on a layer of the NN to output the fixed-point value as depicted in FIG. 4. In particular, FIG. 4 depicts a block diagram 400 for executing instructions on one or more of the processing elements 220 of FIG. 2 in a single layer of an NN using fixed-point values instead of floating-point values according to one or more embodiments described herein. For example, an instruction can be performed in a convolution layer of the NN and can take the form:

$$y_i = \Sigma w_{ik} x_k + b \qquad \text{EQ. 1}$$

where $y_i$ is the output, $x_k$ is the activation input, $w_{ik}$ is the synapse weight, and b is the bias.

The block diagram 400 first multiplies at block 406 the synapse weight wik value (n-bits) 402 and the activation input $x_k$ value (n-bits) 404. The result 408 of the multiplication is in the form 2n-bits and is input into an accumulate engine 414. The result 408 can be summed at block 410 with a feedback signal 418 that is output 416 from the accumulation engine 414 and fed as input 412 into the accumulation engine 414. The feedback signal 418 is in the form 2N+M-bits, where M is determined based on a largest kernel size (e.g., for 5×5 filter, M=5). The output 416 is fed into a quantize engine 420, and a quantized output 422 is generated in the form of n-bits.

The quantize engine 420 converts the floating-point value into a fixed-point value. For example, with reference to FIGS. 3A and 3B, the quantize engine 420 converts the floating-point representation 300, which is a 32-bit value, into a fixed-point representation as an 8-bit value. Quantization is performed based on the following expression to express a fixed-point value x as a quantum value Q(x):

$$x \rightarrow Q(x), s.t. \min \int_{-\infty}^{+\infty} |x - Q(x)|^2 dx. \qquad \text{EQ. 2}$$

For an 8-bit uniform quantization <IL, FL>, where IL is the bit length for the integer part of the value that represents a scope/domain and FL is the bit length for the decimal (float) part of the value that represents a position, the quantum value is expressed as follows:

$$Q(x) = \begin{cases} -2^{IL-1}, & x \leq -2^{IL-1} \\ 2^{IL-1} - \epsilon, & x \geq 2^{IL-1} - \epsilon \\ \lfloor x \rfloor, & \lfloor x \rfloor \leq x \leq \lfloor x \rfloor + \frac{\epsilon}{2} \\ \lfloor x \rfloor + \epsilon, & \lfloor x \rfloor + \frac{\epsilon}{2} < x \leq \lfloor x \rfloor + \epsilon \end{cases} \qquad \text{EQ. 3}$$

where $\epsilon$ is a value of precision.

According to one or more embodiments described herein, IL is determined as floor($\log_2 3\sigma$) where a is the standard deviation of a probability density function, FL is determined as 8−IL, $\epsilon = 2^{-FL}$, and $\lfloor x \rfloor$ is the largest multiplier of E.

Figure 5:
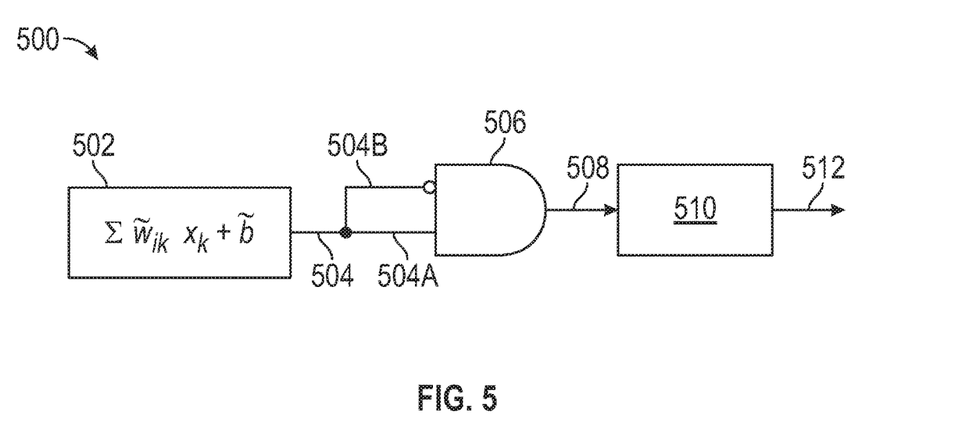
FIG. 5 depicts a block diagram of a hardware implementation of a re-quantization technique according to one or more embodiments described herein.

The processing elements 220 can also perform batch normalization on the fixed-point value. Batch normalization centers dynamic range with a fixed standard deviation. Thus, re-quantization can be performed to maintain precision as desired. FIG. 5 depicts a block diagram of a hardware implementation 500 of the re-quantization according to one or more embodiments described herein.

Batch normalization computation can be merged into the convolution layer of the NN. In such cases, batch normalization is performed to determine yi using the following expression:

$$y_i = \qquad \text{EQ. 4}$$
$$ReLu[BN[\sum w_{ik} x_k + b]] = \begin{cases} 0 & \text{if } \sum \tilde{w}_{ik} x_k + \tilde{b} < 0 \\ \sum \tilde{w}_{ik} x_k + \tilde{b}, & \text{Otherwise} \end{cases}$$

In this example, $\tilde{w}_{ik} = \gamma w_{ik}$ and $\tilde{b} = b + \beta$, where $\gamma$ and $\beta$ are the parameters from batch normalization (BN) layer.

With reference to FIG. 5, for non-zero values, batch normalization is performed using the expression $\Sigma \tilde{w}_{ik} x_k + \tilde{b}$ at block 502. The output 504 is fed into an AND gate 506 as a sign portion 504a and a mantissa portion 504b. The output 508 from the AND gate 506 is fed into a shift register 510 to perform re-quantization for dynamic ranging, and results of the re-quantization are generated as output 512.

Figure 6A:
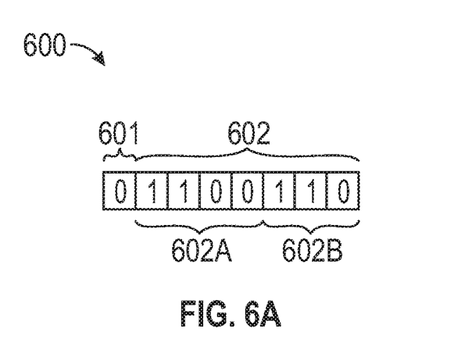
FIG. 6A depicts an 8-bit fixed-point value having a 1-bit sign component and a 7-bit mantissa component according to one or more embodiments described herein.
Figure 6B:
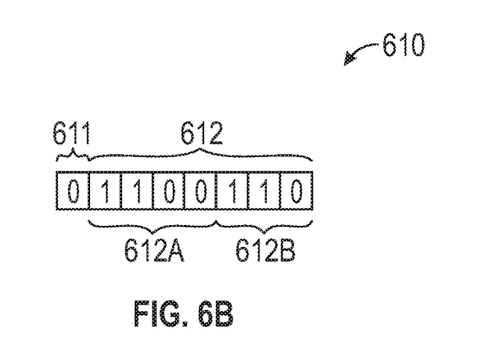
FIG. 6B depicts an 8-bit fixed-point value resulting from a re-quantization technique according to one or more embodiments described herein.

The shift register 510 performs a 1-bit left-shift (L-shift) as depicted in FIGS. 6A and 6B. In particular, FIG. 6A depicts an 8-bit fixed-point value 600 having a 1-bit sign component 601 and a 7-bit mantissa component 602. The mantissa component 602 is further segmented into an integer component 602a and a fractional (decimal) component 602b. The integer component 602a is a 3-bit segment of the mantissa 602 and the fractional component 602b is a 4-bit segment of the mantissa 602. The shift register 510 acts on the fixed-point value 600 to perform the 1-bit L-shift.

The output or results of the 1-bit L-shift are depicted in FIG. 6B, which depicts an 8-bit fixed-point value 610 having a 1-bit sign component 611 and a 7-bit mantissa component 612. The mantissa component 612 is further segmented into an integer component 612a and a fractional (decimal) component 612b. Once the shift is applied, the 3-bit integer component 602a from FIG. 6A is transformed into a 4-bit integer component 612a of the mantissa 612. Similarly, the 4-bit fractional component 602b is transformed to a 3-bit fractional component 612b of the mantissa 612. Prior to the batch normalization being performed, the 8-bit fixed-point value 600 represents the value −8.0, 7.975. After the batch normalization is performed, the 8-bit fixed-point value 610 represents the value −4.0, 3.9375.

Figure 7:
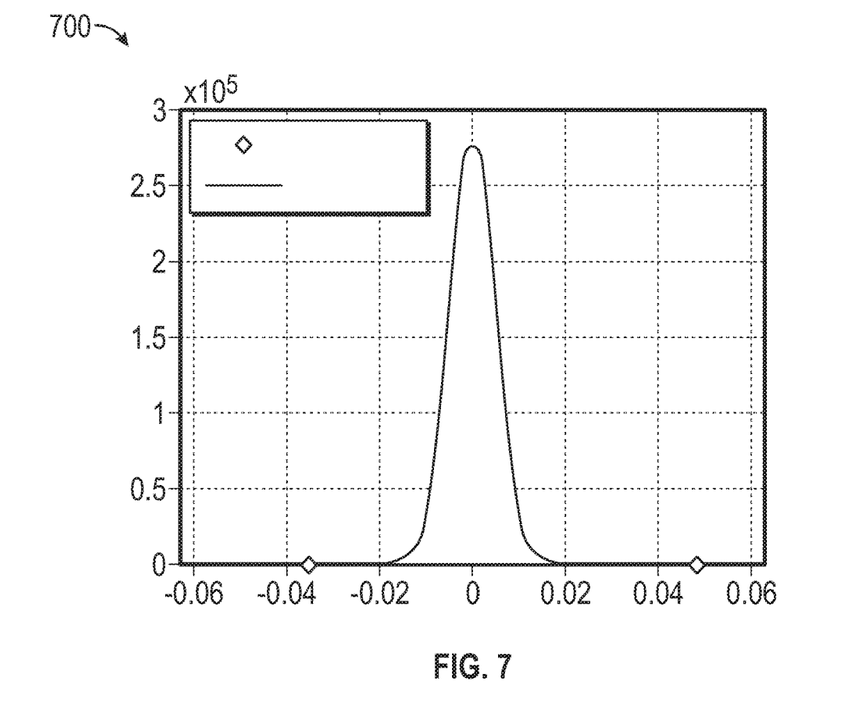
FIG. 7 depicts a graph of the weight distribution of batch normalization according to one or more embodiments described herein.

FIG. 7 depicts a graph 700 of the weight distribution of batch normalization according to one or more embodiments described herein. In this example, the graph 700 plots the weight distribution as a function of the parameter value (x-axis) against a probability density function (PDF) (y-axis). Minimum/maximum values are also depicted.

Figure 8:
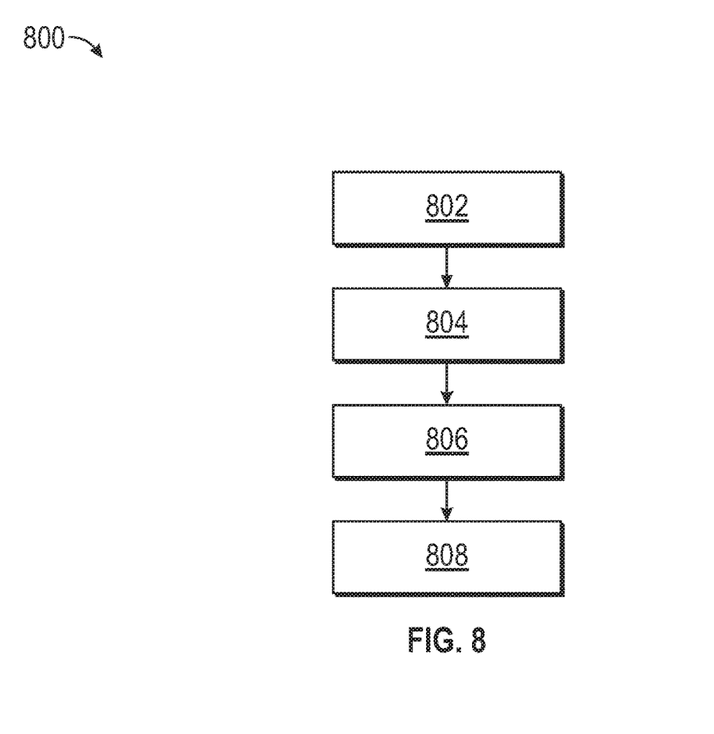
FIG. 8 depicts a flow diagram of a method for fixed-point quantization in neural networks according to one or more embodiments described herein.

FIG. 8 depicts a flow diagram of a method 800 for fixed-point quantization in neural networks according to one or more embodiments described herein. The method 800 can be performed by any suitable processing system and/or processing device, such as the processing system 110 of FIGS. 1 and 2, the accelerator 210 of FIG. 2, the processing system 900 of FIG. 9, or another suitable processing device and/or processing system.

At block 802, a camera (e.g., one of the cameras 120-123, 130-133) associated with the vehicle 100 captures a plurality of images. The processing device 202 stores image data associated with the plurality of images to the memory 204.

At block 804, the NPU instruction fetcher 212 fetches vehicle perception tasks indicative of how to process the plurality of images, and the dispatcher 214 dispatches vehicle perception tasks to the processing elements 220 of the accelerator 210 in communication with the memory 204.

At block 806, at least one of the plurality of processing elements 220 performs the vehicle perception tasks for the vehicle perception using a neural network. In particular, the processing elements 220 performing the vehicle perception tasks by quantizing a fixed-point value based on an activation input and a synapse weight.

At block 808, results of performing the vehicle perception tasks are used to control the vehicle 100. For example, an autonomous vehicle can be controlled to avoid an object detected as a result of the vehicle perception task. In another example, a driver of the vehicle 100 can be alerted to an object detected as a result of the vehicle perception task.

Additional processes also may be included, and it should be understood that the process depicted in FIG. 8 represents an illustration, and that other processes may be added or existing processes may be removed, modified, or rearranged without departing from the scope and spirit of the present disclosure.

Figure 9:
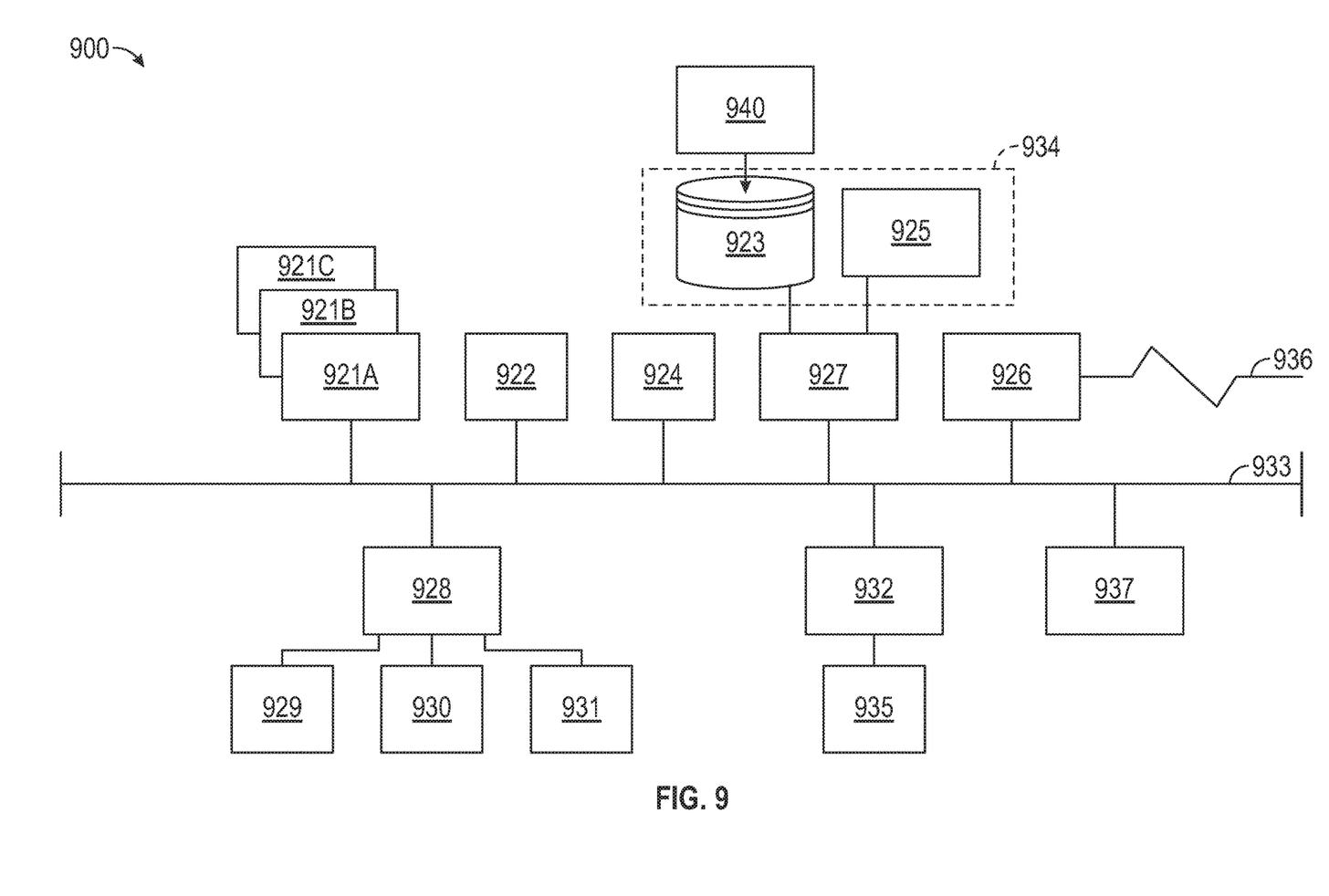
FIG. 9 depicts a block diagram of a processing system for implementing the techniques described herein according to aspects of the present disclosure.

It is understood that the present disclosure is capable of being implemented in conjunction with any other type of computing environment now known or later developed. For example, FIG. 9 depicts a block diagram of a processing system 900 for implementing the techniques described herein. In examples, processing system 900 has one or more central processing units (processors) 921a, 921b, 921c, etc. (collectively or generically referred to as processor(s) 921 and/or as processing device(s)). In aspects of the present disclosure, each processor 921 can include a reduced instruction set computer (RISC) microprocessor. Processors 921 are coupled to system memory (e.g., random access memory (RAM) 924) and various other components via a system bus 933. Read only memory (ROM) 922 is coupled to system bus 933 and may include a basic input/output system (BIOS), which controls certain basic functions of processing system 900.

Further depicted are an input/output (I/O) adapter 927 and a network adapter 926 coupled to system bus 933. I/O adapter 927 may be a small computer system interface (SCSI) adapter that communicates with a hard disk 923 and/or a storage drive 925 or any other similar component. I/O adapter 927, hard disk 923, and storage device 925 are collectively referred to herein as mass storage 934. Operating system 940 for execution on processing system 900 may be stored in mass storage 934. The network adapter 926 interconnects system bus 933 with an outside network 936 enabling processing system 900 to communicate with other such systems.

A display (e.g., a display monitor) 935 is connected to system bus 933 by display adapter 932, which may include a graphics adapter to improve the performance of graphics intensive applications and a video controller. In one aspect of the present disclosure, adapters 926, 927, and/or 932 may be connected to one or more I/O busses that are connected to system bus 933 via an intermediate bus bridge (not shown). Suitable I/O buses for connecting peripheral devices such aps hard disk controllers, network adapters, and graphics adapters typically include common protocols, such as the Peripheral Component Interconnect (PCI). Additional input/output devices are shown as connected to system bus 933 via user interface adapter 928 and display adapter 932. A keyboard 929, mouse 930, and speaker 931 may be interconnected to system bus 933 via user interface adapter 928, which may include, for example, a Super I/O chip integrating multiple device adapters into a single integrated circuit.

In some aspects of the present disclosure, processing system 900 includes a graphics processing unit 937. Graphics processing unit 937 is a specialized electronic circuit designed to manipulate and alter memory to accelerate the creation of images in a frame buffer intended for output to a display. In general, graphics processing unit 937 is very efficient at manipulating computer graphics and image processing, and has a highly parallel structure that makes it more effective than general-purpose CPUs for algorithms where processing of large blocks of data is done in parallel.

Thus, as configured herein, processing system 900 includes processing capability in the form of processors 921, storage capability including system memory (e.g., RAM 924), and mass storage 934, input means such as keyboard 929 and mouse 930, and output capability including speaker 931 and display 935. In some aspects of the present disclosure, a portion of system memory (e.g., RAM 924) and mass storage 934 collectively store an operating system to coordinate the functions of the various components shown in processing system 900.

While the above disclosure has been described with reference to exemplary embodiments, it will be understood by those skilled in the art that various changes may be made and equivalents may be substituted for elements thereof without departing from its scope. In addition, many modifications may be made to adapt a particular situation or material to the teachings of the disclosure without departing from the essential scope thereof. Therefore, it is intended that the present disclosure not be limited to the particular embodiments disclosed, but will include all embodiments falling within the scope thereof.

What is claimed is:

1. A computer-implemented method for vehicle perception, the method comprising:
   capturing a plurality of images at a camera associated with a vehicle and storing image data associated with the plurality of images to a memory;

dispatching vehicle perception tasks to a plurality of processing elements of an accelerator in communication with the memory;

performing, by at least one of the plurality of processing elements, the vehicle perception tasks for the vehicle perception using a neural network, wherein performing the vehicle perception tasks comprises quantizing a fixed-point value based on an activation input and a synapse weight; and controlling the vehicle based at least in part on a result of performing the vehicle perception tasks.

2. The computer-implemented method of claim 1, further comprising performing a batch normalization on the fixed-point value.

3. The computer-implemented method of claim 2, wherein the batch normalization is performed to determine $y_i$ as follows:

$$y_i = ReLu[BN[\sum w_{ik} x_k + b]] = \begin{cases} 0 & \text{if } \sum \tilde{w}_{ik} x_k + \tilde{b} < 0 \\ \sum \tilde{w}_{ik} x_k + \tilde{b}, & \text{Otherwise} \end{cases}$$

where $\tilde{w}_{ik} = \gamma w_{ik}$ and $\tilde{b} = b + \beta$, where $\gamma$ and $\beta$ are parameters from a batch normalization layer of the neural network.

4. The computer-implemented method of claim 2, wherein performing the batch normalization comprises performing a 1-bit left-shift on the fixed-point value using a shift register.

5. The computer-implemented method of claim 1, wherein the fixed-point value is an 8-bit fixed-point value.

6. The computer-implemented method of claim 1, wherein quantizing the fixed-point value comprises converting a floating-point value into the fixed-point value.

7. The computer-implemented method of claim 1, wherein the quantized fixed-point value is expressed as follows:

$$Q(x) = \begin{cases} -2^{IL-1}, x \leq -2^{IL-1} \\ 2^{IL-1} - \epsilon, x \geq 2^{IL-1} - \epsilon \\ \lfloor x \rfloor, \lfloor x \rfloor \leq x \leq \lfloor x \rfloor + \frac{\epsilon}{2} \\ \lfloor x \rfloor + \epsilon, \lfloor x \rfloor + \frac{\epsilon}{2} < x \leq \lfloor x \rfloor + \epsilon \end{cases}$$

where IL is determined as floor($\log_2 3\sigma$) where $\sigma$ is the standard deviation of a probability density function, FL is determined as 8−IL, $\epsilon = 2^{-FL}$, and $\lfloor x \rfloor$ is a largest multiplier of $\epsilon$, which is a value of precision.

8. The computer-implemented method of claim 1, wherein the accelerator further comprises a neural processing unit instruction fetcher, a dispatcher, a level 1 cache, and a level 2 cache.

9. The computer-implemented method of claim 1, wherein the accelerator is communicatively coupled to a host central processing unit via the memory, wherein the accelerator is a special purpose processor and wherein the host central processing unit is a general purpose processor.

10. The computer-implemented method of claim 9, wherein the host central processing unit receives the image data from the camera associated with the vehicle and stores the image data associated with the plurality of images to the memory.

11. A system comprising:
a memory comprising computer readable instructions; and
a processing device for executing the computer readable instructions for performing a method for vehicle perception, the method comprising:

capturing a plurality of images at a camera associated with a vehicle and storing image data associated with the plurality of images to a memory;

dispatching vehicle perception tasks to a plurality of processing elements of an accelerator in communication with the memory;

performing, by at least one of the plurality of processing elements, the vehicle perception tasks for the vehicle perception using a neural network, wherein performing the vehicle perception tasks comprises quantizing a fixed-point value based on an activation input and a synapse weight;

performing a batch normalization on the fixed-point value, wherein performing the batch normalization comprises performing a 1-bit left-shift on the fixed-point value using a shift register; and controlling the vehicle based at least in part on a result of performing the vehicle perception tasks.

12. The system of claim 11, wherein the batch normalization is performed to determine yi as follows:

$$y_i = ReLu[BN[\sum w_{ik} x_k + b]] = \begin{cases} 0 & \text{if } \sum \tilde{w}_{ik} x_k + \tilde{b} < 0 \\ \sum \tilde{w}_{ik} x_k + \tilde{b}, & \text{Otherwise} \end{cases}$$

where $\tilde{w}_{ik} = \gamma w_{ik}$ and $\tilde{b} = b + \beta$, where $\gamma$ and $\beta$ are parameters from a batch normalization layer of the neural network.

13. The system of claim 11, wherein the fixed-point value is an 8-bit fixed-point value.

14. The system of claim 11, wherein quantizing the fixed-point value comprises converting a floating-point value into the fixed-point value.

15. The system of claim 11, wherein the quantized fixed-point value is expressed as follows:

$$Q(x) = \begin{cases} -2^{IL-1}, x \leq -2^{IL-1} \\ 2^{IL-1} - \epsilon, x \geq 2^{IL-1} - \epsilon \\ \lfloor x \rfloor, \lfloor x \rfloor \leq x \leq \lfloor x \rfloor + \frac{\epsilon}{2} \\ \lfloor x \rfloor + \epsilon, \lfloor x \rfloor + \frac{\epsilon}{2} < x \leq \lfloor x \rfloor + \epsilon \end{cases}$$

where IL is determined as floor($\log_2 3\sigma$) where $\sigma$ is the standard deviation of a probability density function, FL is determined as 8−IL, $\epsilon = 2^{-FL}$, and $\lfloor x \rfloor$ is a largest multiplier of $\epsilon$, which is a value of precision.

16. The system of claim 11, wherein the accelerator further comprises a neural processing unit instruction fetcher, a dispatcher, a level 1 cache, and a level 2 cache.

17. The system of claim 11, wherein the accelerator is communicatively coupled to a host central processing unit via the memory, wherein the accelerator is a special purpose processor and wherein the host central processing unit is a general purpose processor, and wherein the host central processing unit receives the image data from the camera associated with the vehicle and stores the image data associated with the plurality of images to the memory.

18. A computer program product comprising:
- a non-transitory computer readable storage medium having program instructions embodied therewith, the program instructions executable by a processing device to cause the processing device to perform a method for vehicle perception, the method comprising:
  - capturing a plurality of images at a camera associated with a vehicle and storing image data associated with the plurality of images to a memory;
  - dispatching vehicle perception tasks to a plurality of processing elements of an accelerator in communication with the memory, wherein the accelerator further comprises a neural processing unit instruction fetcher, a dispatcher, a level 1 cache, and a level 2 cache;
  - performing, by at least one of the plurality of processing elements, the vehicle perception tasks for the vehicle perception using a neural network, wherein performing the vehicle perception tasks comprises quantizing a fixed-point value based on an activation input and a synapse weight; and
  - controlling the vehicle based at least in part on a result of performing the vehicle perception tasks.

* * * * *